United States Patent [19]

Orlandi

[11] 4,340,856
[45] Jul. 20, 1982

[54] APPARATUS FOR TESTING AN ANALOG/DIGITAL CONVERTER

[75] Inventor: Giorgio Orlandi, Milan, Italy

[73] Assignee: Societa Italiana Telecomunicazioni Siemens S.p.A., Milan, Italy

[21] Appl. No.: 158,510

[22] Filed: Jun. 11, 1980

[30] Foreign Application Priority Data

Jun. 12, 1979 [IT] Italy .................... 23478 A/79

[51] Int. Cl.³ ............................. G01R 15/12
[52] U.S. Cl. ..................... 324/73 R; 340/347 M; 340/347 R
[58] Field of Search .... 340/347 M, 347 CC, 347 AD; 324/73 R, 73 AT, 130, 131

[56] References Cited

U.S. PATENT DOCUMENTS

| | | | |
|---|---|---|---|
| 3,603,772 | 9/1969 | Paine et al. | 340/347 AD X |
| 3,816,813 | 6/1974 | Jehu | 324/73 R |
| 4,272,721 | 6/1981 | Beeman | 324/73 R |

OTHER PUBLICATIONS

The Engineering Staff of Analog Devices, Inc., Analog-Digital Conversion Handbook, 6/1972, pp. II-122 to II-128.

Primary Examiner—Thomas J. Sloyan
Attorney, Agent, or Firm—Karl F. Ross

[57] ABSTRACT

To test the performance of an analog/digital converter, used for translating bipolar message signals into 8-bit words, the analog input of the converter is connected across a voltmeter while its digital output works into a buffer register distributing the seven amplitude bits of an emitted code word to one set of stage inputs of a comparator having another set of stage inputs connected to a manually operable word simulator; the sign bit of the code word is entered in a separate store. A logic network with inputs connected to the sign-bit store, the comparator and the word simulator controls two reversible counters which, upon manual operation of the word simulator, emit selected numerical values translated by associated digital/analog converters into output signals fed to the analog/digital converter to be tested. The values emitted by one counter represent entire quantization steps while those emitted by the other counter are aliquot fractions of such a step; the latter counter is started in response to sign-bit changes during an offset check and in response to comparator-output changes during a calibration check.

6 Claims, 8 Drawing Figures

4,340,856

APPARATUS FOR TESTING AN ANALOG/DIGITAL CONVERTER

FIELD OF THE INVENTION

My present invention relates to an apparatus designed to test an analog/digital converter, especially one used in a telecommunication system for digitizing amplitude samples of bipolar message signals.

BACKGROUND OF THE INVENTION

The output of such an analog/digital converter generally is an n-bit code word including a sign bit and (n−1) amplitude bits, with n=8 in many instances. The converter may comprise separate circuits, referred to as weighting networks, for respectively quantizing positive and negative analog samples fed to its input. With samples of opposite polarities but the same absolute magnitude, the two weighting networks ought to emit identical combinations of amplitude bits produced by respective groups of individually calibrated current generators.

The conventional technique for checking the calibration of any such current generator is to feed in an analog signal of a predetermined magnitude and to measure the resulting output current. Such an operation, carried out under static conditions for each current generator, is a time-consuming procedure and furthermore does not reveal any irregularities that may arise during normal use of the converter.

OBJECT OF THE INVENTION

The object of my present invention, therefore, is to provide an apparatus for rapidly and automatically testing an analog/digital converter, particularly but not exclusively one used in a telecommunication system, under normal operating conditions.

SUMMARY OF THE INVENTION

An apparatus according to my invention comprises storage means connectable to the digital output of the converter under test, with (n−1) stages for amplitude bits and with an additional stage for sign bits of an emitted code word. A comparator has a first plurality of inputs connected to a word simulator, operable to generate a variety of test codes of (n−1) bits each, and a second plurality of inputs connected to the (n−1) amplitude-bit stages of the storage means. The comparator alternatively produces two discriminating signals depending upon the relative numerical values of the first and second bit combinations respectively received from the word simulator and the storage means. Logical circuitry with input connections to the word simulator, the comparator and the additional stage of the storage means controls a primary reversible counter, adapted to read out progressively higher first numerical values corresponding to whole quantization steps of the converter under test, and a secondary reversible counter, adapted to read out progressively lower second numerical values corresponding to aliquot fractions of a quantization step. A first and a second digital/analog converter are respectively connected to the two reversible counters for changing each first numerical value into a first output signal and each second numerical value into a second output signal which are algebraically summed by an analog adder before being fed to the analog input of the converter uder test. A meter connected to the adder output in parallel with this analog input measures the magnitude of the resulting analog signal. The two counters are stepped by the logical circuitry, upon the emission of a start signal from the word simulator, in response to changes of the stored sign bit during an offset check and in response to switchovers between the discriminating signals of the comparator during a calibration check.

When the analog/digital converter under test includes separate weighting networks for respectively quantizing positive and negative analog signals, as discussed above, the logical circuitry may be provided with a further output connection to the first digital/analog converter for varying the polarity of the first input signal in response to a selection signal from the word simulator. This minimizes the number of output leads which the primary counter must have in order to command the generation of the desired number of positive and negative output signals by that digital/analog converter.

When the converter to be tested is part of a telecommunication system of the time-division-multiplex (TDM) type with a multiplicity of channels from which analog-signal samples reach that converter in respective time slots of a recurrent frame, one such time slot—not used for message transmission—may be assigned to a testing operation. In that instance the apparatus according to my invention advantageously includes enabling means synchronized with the TDM frame and connected to the storage means for activating same only during the assigned time slot.

The word simulator, pursuant to a more particular feature of my invention, comprises a p-stage shift register in cascade with a q-stage further counter, the combined number p+q of stages of the shift register and the further counter being equal to the number (n−1) of amplitude bits in a code word. With n=8, the shift register and the further counter may have p=4 and q=3 stage outputs, respectively, connected to the second inputs of the comparator for feeding thereto the four least-significant bits and the three most-significant bits of the seven-bit combination. A generator of stepping pulses in the word simulator is repetitively triggerable to advance the bits in p initial steps through the stages of the shift register and to advance the further counter in $2^{q-1}$ additional steps, thereby providing up to $p+2^{q-1}$ second bit combinations; with the specific values given above, the total number of such bit combinations will be 11. These bit combinations are indicated via as many output leads of the primary counter to the associated digital/analog converter.

BRIEF DESCRIPTION OF THE DRAWING

The above and other features of my invention will now be described in detail with reference to the accompanying drawing in which.

SPECIFIC DESCRIPTION

Figure 1:
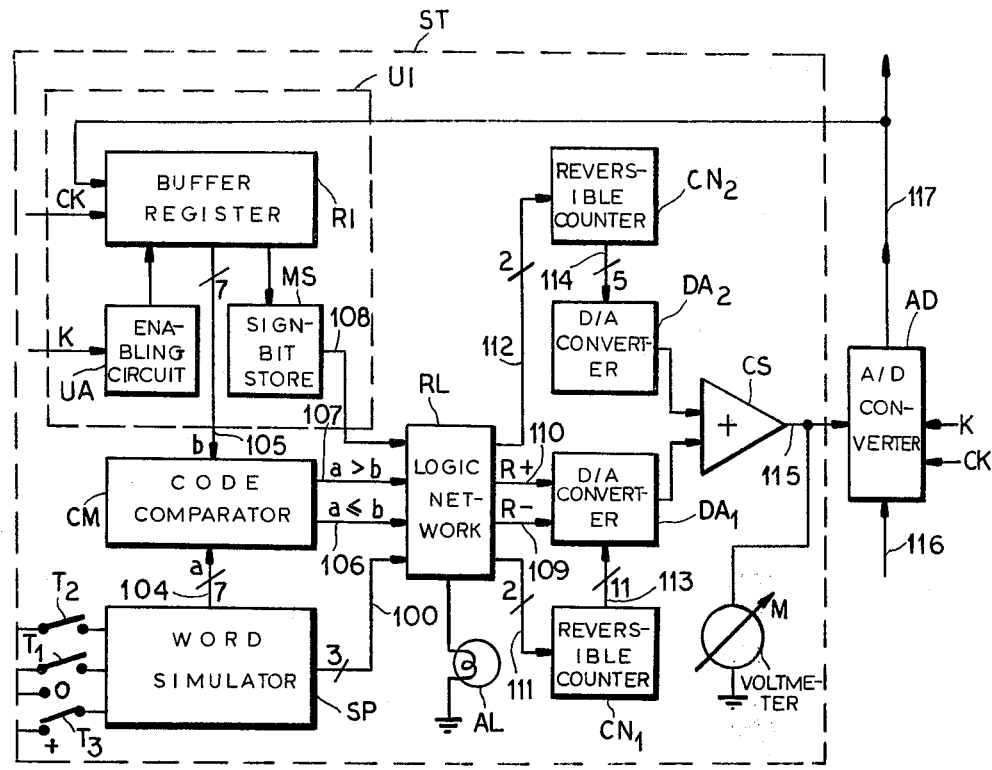
FIG. 1 is a block diagram of an apparatus according to my invention for the testing of an analog/digital converter included in a TDM telecommunication system.
Figure 2:
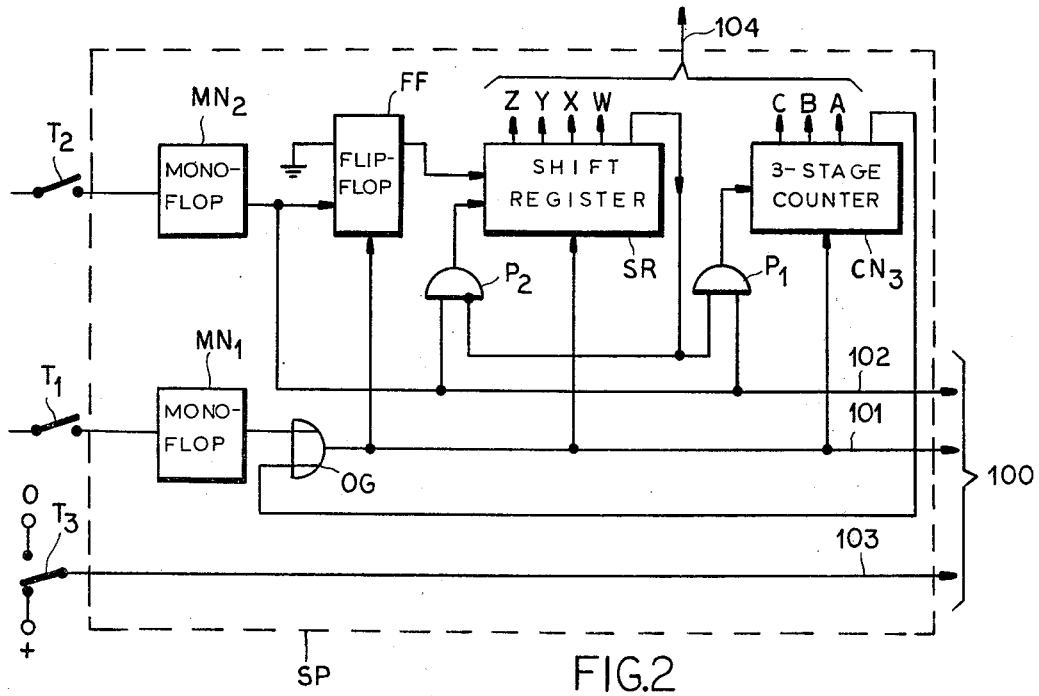
FIG. 2 is a more detailed diagram of a word simulator forming part of the apparatus of FIG. 1.

The testing apparatus shown in FIG. 1, generally designated ST, comprises an input unit UI, a word simulator SP, a seven-stage code comparator CM, a logic network RL, two reversible binary counters $CN_1$ and $CN_2$, two associated digital/analog converters $DA_1$ and $DA_2$, an analog adder CS, and a voltmeter M graduated in fractions of a millivolt. Input unit UI includes a seven-stage buffer register RI, a single-stage sign-bit store MS and an enabling circuit UA. Word simulator SP, more fully described hereinafter with reference to FIG. 2, is provided with three manually operable control switches, namely two single-pole switches or keys $T_1$, $T_2$ and a double-pole switch $T_3$. An analog/digital converter to be tested by the apparatus ST has been diagrammatically represented at AD.

Word simulator SP has a three-lead output multiple 100, extending to logic network RL, and a seven-lead output multiple 104 delivering selected bit combinations a to a first set of inputs of comparator CM which has a second set of inputs receiving bit combinations b via a seven-lead multiple 105 from buffer register RI. Two output leads 106 and 107 of comparator CM supply the logic network with respective discriminating signals; the first of these signals is present when a bit combination a read out from simulator SP has a digital value at most equal to that of a bit combination b simultaneously received from register RI, as indicated by the notation $a \leq b$, whereas the second signal appears in all other instances, according to notation $b > a$. Network RL also receives via a lead 108 the sign bit currently registered in store MS.

Two output leads 109 and 110 of network RL, extending to digital/analog converter $DA_1$, are selectively energized with a signal $R-$ or $R+$ determining the polarity of an analog output signal to be generated by this converter. A pair of two-conductor multiples 111 and 112 emanating from network RL serve for the selective forward or backward stepping of primary and secondary counters $CN_1$ and $CN_2$, respectively. These counters are linked with the associated digital/analog converters $DA_1$ and $DA_2$ via an 11-lead multiple 113 and a 5-lead multiple 114, respectively. Adder CS, with input connections to these two converters, has an output lead 115 tied on the one hand to meter M and on the other hand to an analog input of converter AD shown inserted between an incoming section 116 and an outgoing section 117 of a multichannel transmission link forming part of a time-division-multiplex (TDM) communication system. Channel-counting signals K from a nonillustrated time base identify the several time slots of a recurrent TDM frame assigned to respective message channels. One particular channel (e.g. No. 13), not used for message transmission, is assigned to the tester ST whose enabling circuit UA is activated by the corresponding counting signal K to make the buffer register RI receptive to the 8-bit code word appearing during this time slot in outgoing section 117 in response to an analog test signal present on the output 115 of adder CS. Converter AD and buffer register RI are stepped by clock pulses CK (eight per time slot) also generated by the aforementioned time base. A signaling device AL, here shown as a lamp, is also connected to network RL in order to apprise the operator of the connected execution of a testing phase.

As illustrated in FIG. 2, word simulator SP comprises two monostable multivibrators or monoflops $MN_1$, $MN_2$ respectively triggerable by closure of switches $T_1$, $T_2$ to energize a lead 101 or 102 for a period (indicated at t in FIG. 3a) which should not be less than that of a TDM frame. These two leads are part of multiple 100 which further includes a lead 103 selectively connectable, via switch $T_3$, to zero potential (ground) or positive voltage (e.g. +5 V). Monoflop $MN_2$ also feeds a resettling input of a data-type flip-flop FF whose set output is tied to an input of a four-stage shift register SR with four stage outputs, labeled Z, Y, X, W, and a fifth output connected to a noninverting input of an AND gate $P_1$ and to an inverting input of another AND gate $P_2$ both having second inputs tied to lead 102. AND gate $P_1$ has its output connected to a stepping input of a three-stage binary pulse counter $CN_3$ with stage outputs labeled C, B, A and with a fourth output connected through an OR gate OG to lead 101 from which branches extend downstream of that OR gate to a setting input of flip-flop FF and to clearing inputs of shift register SR and counter $CN_3$. The output of AND gate $P_2$ is connected to a stepping input of the shift register.

OPERATION

I shall now describe, with reference to FIGS. 3a–3f, the operation of the apparatus of FIGS. 1 and 2 which takes place in two phases, namely an offset check and a calibration check.

While the two digital/analog converters $DA_1$ and $DA_2$ may readily be adjusted to have a common zero-voltage reference point, which has been designated $OV_d$ in the graphs of FIGS. 3a–3f, the corresponding reference points $OV_m$ of meter M and $OV_a$ of the analog/digital converter AD will usually lie at different levels. Thus, an initial offset check is designed to correlate these reference points with one another so that the performance of converter AD may be properly evaluated during the subsequent calibration check of its current generators.

When starting the offset check, the operator briefly closes switch $T_1$ to trip the monoflop $MN_1$ whereby lead 101 is energized and, aside from setting flip-flop FF and clearing components SR and $CN_3$ of simulator SP, causes the zero-setting of counters $CN_1$ and $CN_2$ by way of logic network RL. The potential of output lead 115 of adder CS, FIG. 1, thus corresponds at this point to $OV_d$ which in the example given in FIG. 3a lies below the reference level $OV_m$ of meter M. This graph represents a positive offset, so named because the zero level $OV_a$ of converter AD lies above reference level $OV_m$.

In the presence of a signal K indicating the time slot assigned to testing, the converter AD sees the potential $OV_d$ on its analog input 115 as a negative voltage of an absolute magnitude exceeding one quantization step (assumed to be equal to 1 mV) represented in this instance by level $-1V_d$. Thus, buffer register RI of input unit UI receives from the digital converter output an 8-bit code word with a sign bit of logical value "1", entered in store MS, and with seven amplitude bits of which all but the last have the logical value "0". These amplitude bits are transmitted via multiple 105 to comparator CM as bit combination b whose numerical value exceeds that of the all-zero bit combination a delivered to the comparator at the same time by way of multiple 104 from the stage outputs A, B, C, W, X, Y, Z of the cleared shift register SR and counter $CN_3$. As a result, comparator CM emits the discriminating signal $a \leq b$ on lead 106 which, however, is not taken into consideration by network RL in this operational phase. Instead, an internal switch (e.g. a flip-flop) of that network set by the start signal on lead 101 conditions its logical circuitry to advance the primary counter $CN_1$ with simultaneous emission of signal R+ over lead 100 in response to the "one" bit registered in store MS.

In the next-following TDM frame, counter $CN_1$ has a bit "1" in its last digital position wherefore converter $DA_1$ transmits to the output lead 115 of adder CS a voltage level $+1V_d$ which, in the example of FIG. 3a, still lies below level $OV_a$. As a result, the amplitude bits fed to register RI are all "0" but the bit entered in store MS does not change. Logic network RL, therefore, again steps the counter $CN_1$ forward and emits signal R+ so that the potential of lead 115 takes another jump, to level $+2V_d$ detected by converter AD in a further TDM frame. Since the a/d converter now sees a positive input signal, the sign bit in store MS assumes the logical value "0" and this change is communicated to network RL via lead 108. Network RL thereupon stops the primary counter $CN_1$ and sends a backward-stepping command to the secondary counter $CN_2$ which, through adder CS, lowers the voltage on lead 115 by one-eighth of a quantization step, i.e. by 0.125 mV under the assumed conditions. As this has no effect upon the relative polarity of the input signal as seen by converter AD, the same procedure is repeated three more times. This, finally, brings down the signal voltage to slightly less than the zero point $OV_a$ of the converter, causing another bit change in store MS which is detected by network RL; the latter then stops the counter $CN_2$ and energizes lamp AL to alert the operator to the fact that the offset check has been completed.

The operator, upon inspecting the voltmeter M, notes that it reads +0.6 mV which represents the offset between converter AD and apparatus ST when the last setting of counter $CN_1$ (with final bits 0-1-0) is used as a reference point for the calibration checks to be performed subsequently. Such a reference point has been indicated at $V_o$ in FIGS. 3c and 3d.

Figure 3A:
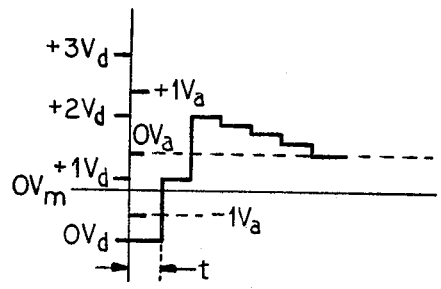
FIGS. 3a–3f are a set of explanatory graphs relating to different modes of operation of the apparatus of FIG. 1.
Figure 3B:
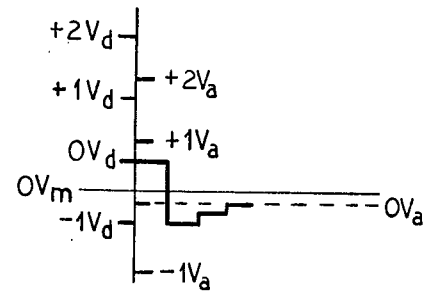

FIG. 3b represents an instance of a negative offset, with reference level $OV_m$ lying below the zero point $OV_d$ of the tester. After the operator has momentarily closed switch $T_1$ to reset the counters $CN_1$ and $CN_2$ and to clear the word simulator SP, converter AD sees a positive input voltage and thus sends a bit "0" to store MS. Logic network RL, responding to the start signal on lead 101, again advances the counter $CN_1$ by one step but energizes its lead 109 to transmit signal R− to converter $DA_1$ in view of the initial zero reading of lead 108. Thus, the potential of lead 115 is reduced to the level $-1V_d$ which lies below reference level $OV_m$, thereby changing the contents of sign-bit store MS in the next cycle. Network RL, upon detecting this change, stops the counter $CN_1$ and advances the counter $CN_2$ in as many forward steps, during two successive cycles in this instance, as are necessary to cross the reference level $OV_m$ in the opposite direction. When the second changeover occurs, the logic network arrests the counter $CN_2$ and lights the lamp AL to alert the operator who reads an offset of −0.2 mV on voltmeter M. The last setting of counter $CN_1$ (with final bits 0-0-1) then becomes the reference point $V_o$ of FIGS. 3e and 3f.

Figure 3C:
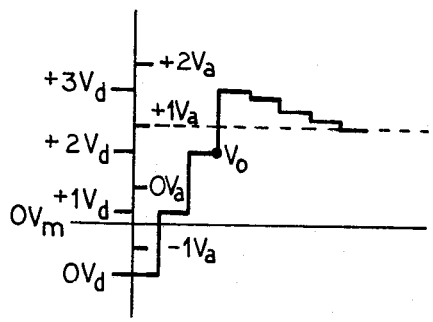

With the offset check performed, the apparatus is ready to test the calibration of the weighting networks of converter AD. FIG. 3c relates to a calibration check on the positive quanta generated by the converter, with counter $CN_1$ arrested in the position last reached after the procedure described with reference to FIG. 3a so that its reference point $V_o$ lies at the level $+22V_d$.

In order to check on the positive weighting network of the converter, the operator places switch $T_3$ in the illustrated position so as to send a selection signal to logic network RL by way of lead 103. A brief closure of switch $T_2$ then trips the monoflop $MN_2$ to energize the lead 102 whereby logic network RL is instructed to reset the counter $CN_2$ (but not $CN_1$) to zero. Since shift register SR has been cleared, the pulse on lead 102 passes the AND gate $P_2$ to load that register with a bit "1" from flip-flop FF which was previously set by the start signal emitted over lead 101; the flipflop is reset on the trailing flank of this pulse. Register SR then emits the bit "1" on its stage output Z representing the least-significant position of bit combination a. Since the voltage $V_o$ on output lead 115 lies within ±1 mV of the converter ground $OV_a$, the code word read out during the assigned time slot to input unit UI has all-zero amplitude bits (the sign bit entered in store MS is no longer relevant in this operational phase) so that combination b fed over multiple 105 to comparator CM has a lower numerical value than combination a. The comparator, accordingly, energizes its output lead 107 which, with logic network RC conditioned by the pulse on lead 102 to detect the discriminating signal emitted by the comparator, causes a forward-stepping of counter $CN_1$ and the energization of lead 110 whereby converter $DA_1$ raises the output voltage of adder CS by one quantizing step to level $+3V_d$. Since this level lies above level $+1V_a$, converter AD next emits a code word with a "one" bit in its least-significant position so that the numerical values of combinations a and b becomes equal. As a result, comparator CM energizes its output lead 106 in lieu of lead 107, the changeover being detected by logic network RL which stops the counter $CN_1$ and initiates a series of reverse-stepping cycles of counter $CN_2$ until, after the fourth step, the voltage on lead 115 drops slightly below the next-lower quantization step represented by level $+1V_a$. When this occurs, comparator CM re-energizes its lead 107 whereupon network RL stops the counter $CN_2$ and lights the lamp AL, alerting the operator to the completion of the calibration step for the first current generator of the positive weighting network of converter AD.

At that point the reading of voltmeter M is +1.6 mV. From this value the operator must deduct the previously determined offset of +0.6 mV so that the true reading becomes +1 mV, proving accurate calibration.

The operator, wishing to test the next current generator of that weighting network, then presses key $T_2$ again whereby another pulse on lead 102 shifts the previously inserted "one" bit in register SR by one stage as gate $P_2$ energizes its stepping input to load its first stage with a "zero" bit from the reset flip-flop FF. With stage output Y now carrying positive voltage, the bit combination a fed to comparator CM via multiple 104 has a higher numerical value than combination b read out from buffer register RI. Logic network RL, reactivated by the pulse on lead 102, detects the signal a>b on lead 107 and repeats the previous procedure, with counter $CN_2$ initially reset while counter $CN_1$ raises the output signal by 1 mV above the earlier peak of $+3V_d$. The ensuing energization of lead 106 in lieu of lead 107 again initiates a reverse-stepping of counter $CN_2$ until the discriminating signal changes once more; the reading of meter M should then be +2.6 mV, corresponding to the desired true value of +2 mV with consideration of the offset of +0.6 mV.

In an analogous manner, nine more calibration tests can be performed with no resetting of the primary counter $CN_1$. The third and fourth tests shift the "one" bit in register SR to energize its stage outputs X and W, respectively. On the next test this bit reaches the fifth output of register SR, unblocking the AND gate $P_1$ and reblocking the AND gate $P_2$ to prevent further shifts; the first stage output C of counter $CN_3$ is thereby energized to emit a code combination 0-0-1-0-0-0-0 on multiple 104. In the six further tests the four least-significant bits on outputs Z, Y, X, W retain the value "0" while the three most-significant bits on outputs C, B, A assume all possible values to 1-1-1. The corresponding settings of counter $CN_1$ are communicated to converter $DA_1$ via the 11 leads of multiple 113.

A twelfth closure of switch $T_2$, after counter $CN_3$ has reached its full count, energizes the fourth output thereof to provide a new start pulse (via OR gate OG) on lead 101 with setting of flip-flop FF, clearing of shift register SR and zeroizing of counters $CN_1$, $CN_2$ and $CN_3$. A new series of tests, beginning with an offset check, can then be undertaken.

Figure 3D:
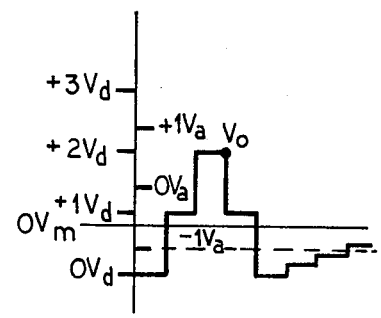

Let us now assume that the operator, having performed the offset check according to FIG. 3a, wishes to test the current generators of the negative weighting network in converter AD. For this purpose it is necessary to place the switch $T_3$ in its alternate position before pressing key $T_2$. With counter $CN_2$ reset to zero by this action, the output signal on lead 115 is again at the point $V_o$, as shown in FIG. 3d. The coincidence of discriminating signal a>b on lead 107 with zero voltage on lead 103 causes network RL to command a reverse stepping of counter $CN_1$, to level $+1V_d$ (with the positive sign being implemented, as before, by energization of lead 110 carrying polarity signal R+), which is negative relatively to zero point $OV_a$ but still insufficient to change the all-zero bit combination on multiple 105. The logic network, therefore, lets the counter $CN_1$ take another step backward to level $OV_d$ which results in the emission by converter AD of a code word with a bit "1" in its least-significant position. As bit combinations a and b are now equal, comparator CM sends out the discriminating signal a≦b on lead 106 whereupon network RL stops the counter $CN_1$ and advances the counter $CN_2$ until the output signal on lead 115 surpasses the level $-1V_a$, causing another changeover. The operator, noting the lighting of lamp AL, then inspects the meter M and finds a reading of −0.4 mV; subtraction of the offset of +0.6 mV from this value yields the correct reading of −1 mV.

In the manner described above, the operator may now check the calibration of other negative quanta by again pressing key $T_2$. On the second test, with energization of stage output Y of shift register SR, counter $CN_1$ takes another backward step to level $-1V_d$; this, actually, involves a one-step advance coupled with an energization of lead 109 to produce the polarity signal R−. After the stopping of this counter by the first changeover of the discriminating signal, and the halting of the advance of counter $CN_2$ by the second changeover, the reading of meter M should be −1.4 mV corresponding to the correct value of −2 mV. The tests may be continued for all 11 bit combinations a that can be generated by word simulator SP.

Figure 3E:
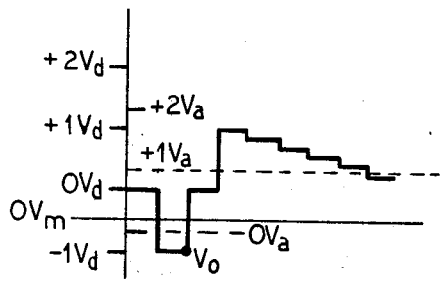
Figure 3F:
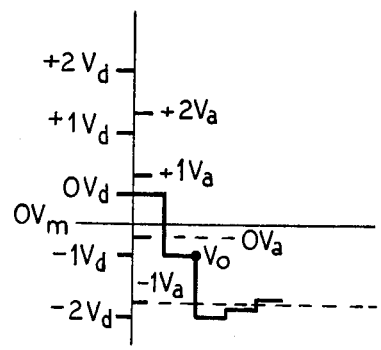

FIG. 3e represents the situation where, with a negative offset as shown in FIG. 3b, the calibration of the current generators in the positive weighting network of converter AD is to be checked. With switch $T_3$ again in its illustrated position applying positive voltage to lead 103, the first closure of switch $T_2$ brings about a backward stepping of counter $CN_1$ to level $OV_d$ from the reference point $V_o$ shown in FIG. 3e coinciding with signal level $-1V_d$. Since the voltage on lead 115 still lies below the first quantization level $+1V_a$ of converter AD, the amplitude bits read out to input unit UI do not change from their all-zero value so that counter $CN_1$ takes another forward step, i.e. returns to its previous position with a switchover from signal R− to signal R+ by network RL. This changes the relative numerical values of bit combinations a and b, halting the advance of the primary counter $CN_1$ and commanding a backward stepping of the secondary counter $CN_2$ until the output signal again crosses the level $-1V_a$. At this point the reading of meter M is +0.8 mV which, when incremented by the amount of the negative offset of −0.2 mV, establishes the correct value of +1 mV. Further readings can then be taken after repeated closures of switch $T_2$ as already described.

If it were desired to test the calibration of the current generators in the negative weighting network with the same negative offset, the operator would reverse the switch $T_3$ to ground the lead 103 (as in the situation described with reference to FIG. 3d) before pressing the key $T_2$ for the first time. Starting at the reference point $V_o$ of FIG. 3f, counter $CN_1$ then takes a negative step (by advancing with concurrent energization of lead 109) to level $-2V_d$ which is below level $-1V_a$ of converter AD. The resulting change in the discriminating signal from comparator CM halts the primary counter $CN_1$ and causes successive advances of the secondary counter $CN_2$ until the output signal crosses the level $-1V_a$ a second time, giving a meter reading of −1.2 mV which yields the correct value of −1 mV upon being algebraically summed with the offset of −0.2 mV. Again, additional tests can be performed in the manner already described.

From the foregoing description it will be apparent that the provision of polarity leads 109 and 110 eliminates the need for duplicating the 11 leads of multiple 113 in order to provide both positive and negative readings of counter $CN_1$. Obviously, network RL must include means for indicating the return of this counter to zero in order to be able to change between polarity signals R+ and R− when performing operations such as those described above with reference to FIGS. 3d and 3e. In the case of counter $CN_2$, the five leads of multiple 114 allow for the direct readout of eight positive and eight negative voltage increments as well as a zero setting; while it would also be possible to extend polarity-indicating output leads from logic network RL to converter $DA_2$, this would not materially simplify the circuitry.

Though the described mode of operation requires the repeated intervention of an operator, the testing sequence could also be further automated with the aid of a processor which stores the voltmeter reading after the offset check and correspondingly modifies the readings obtained during the subsequent calibrating checks.

I claim:

1. An apparatus for testing an analog/digital converter, comprising:
   storage means connectable to a digital output of an analog/digital converter to be tested, said storage means being provided with (n−1) stages for amplitude bits and with an additional stage for a sign bit of an n-bit code word emitted by the converter under test;

a word simulator operable to generate a variety of test codes of (n−1) bits;

a comparator with a first plurality of inputs connected to said word simulator and with a second plurality of inputs connected to said (n−1) stages for respectively receiving therefrom a first and a second bit combination and for alternatively producting two discriminating signals depending upon the relative numerical values of said bit combinations;

a reversible primary counter adapted to read out progressively higher first numerical values corresponding to whole quantization steps of the converter under test;

a reversible secondary counter adapted to read out progressively lower second numerical values corresponding to aliquot fractions of a quantization step;

a first digital/analog converter connected to said primary counter for changing each of said first numerical values into a first output signal;

a second digital/analog converter connected to said secondary counter for changing each of said second numerical values into a second output signal;

an analog adder connected to said first and second digital/analog converters for algebraically summing said first and second output signals and feeding the resulting signal to an analog input of the converter under test;

meter means connected to said adder in parallel with said analog input for measuring the magnitude of said resulting signal; and logical circuitry with input connections to said word simulator, said comparator and said additional stage and with output connections to said counters for stepping said counters, upon receiving a start signal from said word simulator, in response to changes of said sign bit during an offset check and in response to switchovers between said discriminating signals during a calibration check.

2. An apparatus as defined in claim 1 wherein the converter under test includes separate circuits for quantizing positive and negative analog signals, said logical circuitry having a further output connection to said first digital/analog converter for varying the polarity of said first output signal in response to a selection signal from said word simulator.

3. An apparatus as defined in claim 1 or 2 wherein said word simulator comprises a p-stage shift register in cascade with a q-stage further counter, together having $p+q=n-1$ stage outputs connected to said first plurality of inputs for respectively emitting p least-significant bits and q most-significant bits of said first bit combination, and a stepping-pulse generator repetitively triggerable to advance a bit in p initial steps through the stages of said shift register and to advance said further counter in $2^{q-1}$ additional steps, thereby providing up to $p+2^{q-1}$ first bit combinations, said primary counter having $p+2^{q-1}$ output leads extending to said first digital/analog converter.

4. An apparatus as defined in claim 3 wherein said word simulator is provided with a first monoflop operable by a first switch to reset said shift register and said further counter and to transmit to said logical circuitry a first command for resetting said primary and secondary counters preparatorily to an offset check, said stepping-pulse generator comprising a second monoflop operable by a second switch to transmit to said logical circuitry a second command for resetting only said secondary counter concurrently with any stepping of said shift register and said further counter.

5. An apparatus as defined in claim 4 wherein said word simulator further comprises a flip-flop settable by said first monoflop and resettable by said second monoflap, said flip-flop having a set output connected to said shift register for loading the first stage thereof with a "one" bit upon the first actuation of said second switch.

6. An apparatus as defined in claim 1 or 2 for testing an analog/digital converter of a telecommunication system with a multiplicity of channels from which analog-signal samples reach the converter under test in respective time slots of a recurrent frame, one of said time slots being assigned to a testing operation, further comprising enabling means connected to said storage means for activating same only during said assigned time slot.

* * * * *